United States Patent [19]
Nagaraj et al.

[11] Patent Number: 5,995,564
[45] Date of Patent: Nov. 30, 1999

[54] APPARATUS FOR DETECTING WHEN A DYNAMIC SIGNAL IS STABLE

[75] Inventors: Krishnaswamy Nagaraj, Somerville, N.J.; Pan Wu, Allentown, Pa.

[73] Assignee: Lucent Technologies Inc., Murray Hill, N.J.

[21] Appl. No.: 08/993,328

[22] Filed: Dec. 18, 1997

Related U.S. Application Data

[60] Provisional application No. 60/033,731, Dec. 20, 1996.

[51] Int. Cl.$^6$ ..................................................... H04L 27/06
[52] U.S. Cl. ........................................... 375/344; 375/377
[58] Field of Search ..................................... 375/344, 377, 375/229, 374; 455/75; 327/536, 157, 306, 307, 308, 309, 310

[56] References Cited

U.S. PATENT DOCUMENTS

| | | | |
|---|---|---|---|
| 5,511,235 | 4/1996 | Duong | 455/75 |
| 5,592,120 | 1/1997 | Palmer et al. | 327/536 |
| 5,699,018 | 12/1997 | Yamamoto et al. | 330/297 |

OTHER PUBLICATIONS

"A Low Jitter 5 MHz to 180 MHz Clock Synthesizer for Video Graphics" 1992 IEEE; AT&T Bell Laboratories (1 pg.).

Primary Examiner—Chi H. Pham
Assistant Examiner—Jean B. Corrielus

[57] ABSTRACT

An apparatus for detecting when a dynamic signal is stable. The apparatus is couplable to a first charge pump connected to receive the dynamic signal and generate a first signal as a function of the dynamic signal. The first charge pump has a predetermined capacitance and current. In one embodiment, the apparatus includes: (1) a second charge pump connected to receive the dynamic signal and in parallel with the first charge pump, the second charge pump having a smaller capacitance and discharge current than the first charge pump and configured to produce a second signal as a function of the dynamic signal, (2) a third charge pump connected to receive the dynamic signal and in parallel with the first charge pump and the second charge pump, the third charge pump having a smaller capacitance and larger discharge current than the first charge pump and configured to produce a third signal as a function of the dynamic signal and (3) control logic configured to receive the second and third signals and produce an active signal when the second and third signals are substantially opposite to each other, logically, indicating that the dynamic signal is stable.

24 Claims, 7 Drawing Sheets

APPARATUS FOR DETECTING WHEN A DYNAMIC SIGNAL IS STABLE

CROSS-REFERENCE TO RELATED APPLICATION

This Application claims the benefit of U.S. Provisional Application Ser. No. 60/033,731, filed on Dec. 20, 1996, entitled "Apparatus for Detecting when a Dynamic Signal is Stable," commonly assigned with the present invention and incorporated herein by reference.

TECHNICAL FIELD OF THE INVENTION

The present invention is directed, in general, to an apparatus and method for detecting stability of a dynamic signal, and more specifically, to an apparatus that employs charge pumps to detect when a dynamic signal is stable.

BACKGROUND OF THE INVENTION

It is desirable, in many applications, to adjust the gain levels of a signal. For example, when a signal is transmitted over a line, it may be necessary to increase the gain of the signal to account for degradation in signal clarity and strength. Signal gain may require adjustment (up or down) depending on, for instance, the distance a signal travels from point-to-point. One common device used to adjust signal gain is an automatic gain control (AGC) loop. An AGC loop automatically adjusts the output gain of a signal to a specific level as a function of its input.

In larger systems, it may be necessary to employ several AGC loops connected together to control signal gain. A requirement associated with nesting interconnecting AGC loops is that when one loop is active, the other loop(s) should remain stable to avoid transmitting an unstable signal (garbage data) to the active loop thereby ensuring that the system converges. To verify the stability of an AGC loop, many devices monitor the voltage produced by a charge pump of an AGC loop to determine when the AGC loop is stable. The charge pumps are typically used in the AGC loop to boost or reduce the voltage of a signal to a particular level, then freeze the loop at that level. By monitoring the output voltage (a signal) of the charge pump, it is possible, in principal, to ascertain when an AGC loop is stable.

Determining when the resulting output signal of the AGC loop is stable based on the output voltage of the charge pump, however, can be arduous or impractical. First, it is difficult to detect the stability of the loop by monitoring the output voltage of the charge pump because the final values of the output voltage are often unknown. Second, it is also difficult to detect the stability of the loop by comparing the output voltage of the charge pump because the values of the output voltage are dynamic having differing values even when the loop is stable. Third, to reduce the variations in the output voltage of the charge pump when the loop becomes stable requires a large capacitor (resulting in a large time constant) in the charge pump. As a result, the variations in the output voltage are dampened during both the active and stable periods. Thus, to detect the stability of the loop by monitoring the variations (as the variations are being tempered) in the output voltage with the constraints on the allowable time interval is difficult, if not impossible.

Presently, most detection circuits are design specific. The detection circuits only function with specific AGC loops having predetermined charge pump voltages and time intervals. Other detection circuits are complicated and expensive. Thus, it is difficult and often expensive to design stability detection circuits to operate in a multiple interconnected AGC loop environment, since each AGC loop may have a unique stability characteristic.

Accordingly, what is needed in the art is an improved apparatus that automatically detects when a dynamic signal is stable, without knowing, beforehand, the level and time that is takes a particular dynamic signal to reach stability. Additionally, such an apparatus should employ a simple, low-cost and substantially standardized design (for easy interchangeability in different systems).

SUMMARY OF THE INVENTION

To overcome the deficiencies in the prior art, the present invention provides an apparatus for detecting when a dynamic signal is stable. The apparatus is couplable to a first charge pump connected to receive the dynamic signal and generate a first signal as a function of the dynamic signal. The first charge pump has a predetermined capacitance and current. In one embodiment, the apparatus includes: (1) a second charge pump connected to receive the dynamic signal and in parallel with the first charge pump, the second charge pump having a smaller capacitance and discharge current than the first charge pump and configured to produce a second signal as a function of the dynamic signal, (2) a third charge pump connected to receive the dynamic signal and in parallel with the first charge pump and the second charge pump, the third charge pump having a smaller capacitance and larger discharge current than the first charge pump and configured to produce a third signal as a function of the dynamic signal and (3) control logic configured to receive the second and third signals and produce an active signal when the second and third signals are substantially opposite to each other, logically, indicating that the dynamic signal is stable.

In another embodiment, the apparatus, includes (1) a second charge pump connected to receive the dynamic signal and in parallel with the first charge pump, the second charge pump having a smaller capacitance and larger charge current than the first charge pump and configured to produce a second signal as a function of the dynamic signal, (2) a third charge pump connected to receive the dynamic signal and in parallel with the first charge pump and the second charge pump, the third charge pump having a smaller capacitance and smaller charge current than the first charge pump and configured to produce a third signal as a function of the dynamic signal and (3) control logic configured to receive the second and third signals and produce an active signal when the second and third signals are inverse to each other, logically, indicating that the dynamic signal is stable.

Thus, the present invention is able to automatically detect when a dynamic signal is stable, without knowing beforehand, when a dynamic signal level has reached stability and how long it takes to do so. Additionally, the present invention employs a simple, low-cost and substantially standardized design; making the present invention a desirable detector.

The foregoing has outlined, rather broadly, features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
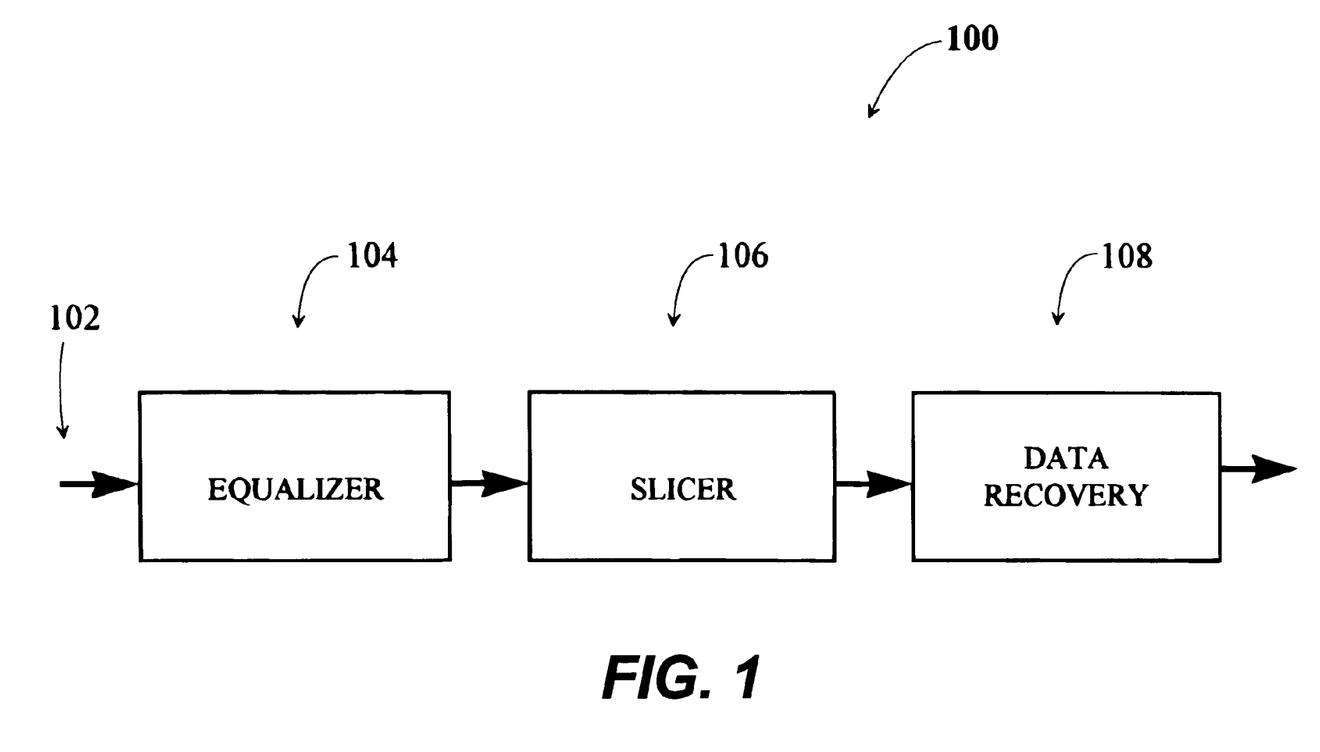
FIG. 1 illustrates a block diagram of an exemplary environment for the present invention.

Referring initially to FIG. 1, illustrated is a block diagram of an exemplary environment for the present invention. The environment is a general telecommunication system 100 including: a line 102, an equalizer 104, a slicer 106 and a data recoveror 108.

Figure 2:
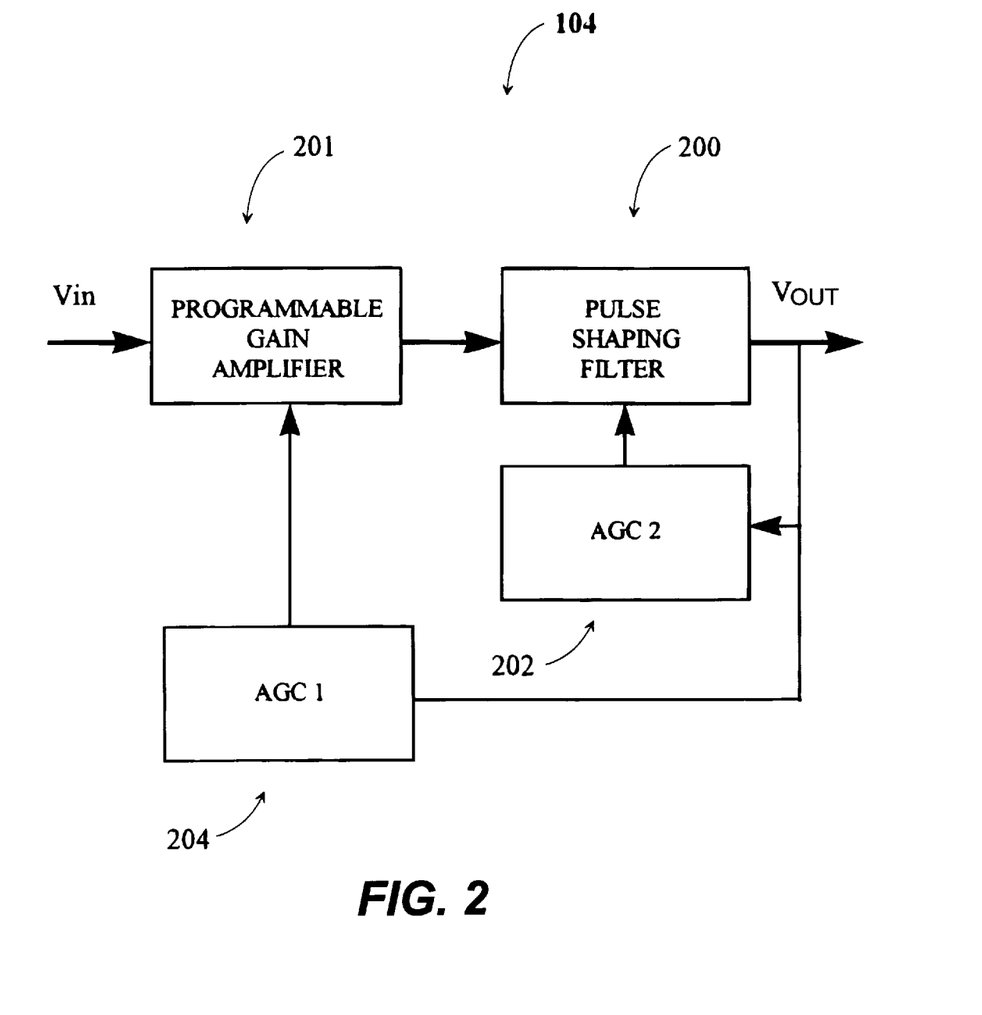
FIG. 2 illustrates a block diagram of the equalizer of FIG. 1.

FIG. 2 illustrates a block diagram of the equalizer 104 of FIG. 1. The equalizer 104 adjusts the gain of an input signal in different frequencies based on its output. As shown in the exemplary embodiment, the equalizer 104 includes a programmable gain amplifier 201 with its gain controlled by a first automatic gain controller 204 and a pulse shaping filter 200 with its gain controlled by a second automatic gain controller 202. The total gain of an output voltage Vout versus an input voltage Vin is the product of the gain of the programmable gain amplifier 201 and the gain of the pulse shaping filter 200.

When a first automatic gain control loop, including the programmable gain amplifier 201 and the first automatic gain controller 204, is active, the second automatic gain control loop, including the pulse shaping filter 200 and the second automatic gain controller 202, should be stable. Otherwise, a change in the output voltage Vout contains information about changes of the first and second automatic gain control loops. This information, however, cannot be used to modify the programmable gain amplifier 201 through the first automatic gain controller 204 because the first automatic gain control loop will be confused by the variations from the second automatic gain control loop. Moreover, the change in the second automatic gain control loop may change the output voltage Vout in a direction that precludes the first and second automatic control loops from converging. A similar situation arises when the second automatic control loop is active.

Therefore, to make sure only one loop is operating at a time, an apparatus or detector is used to detect when an operating loop becomes stable. When the operating loop becomes stable, it is time to start another loop and monitor the stability of the new operating loop. Since it is preferable to include a detector per automatic gain control loop, the detector should be designed to meet the specifications of the particular loop it is serving. The telecommunications system 100 including the equalizer is, obviously, only one application where the present invention may be employed; other environments and applications will become apparent from the foregoing description.

Figure 3:
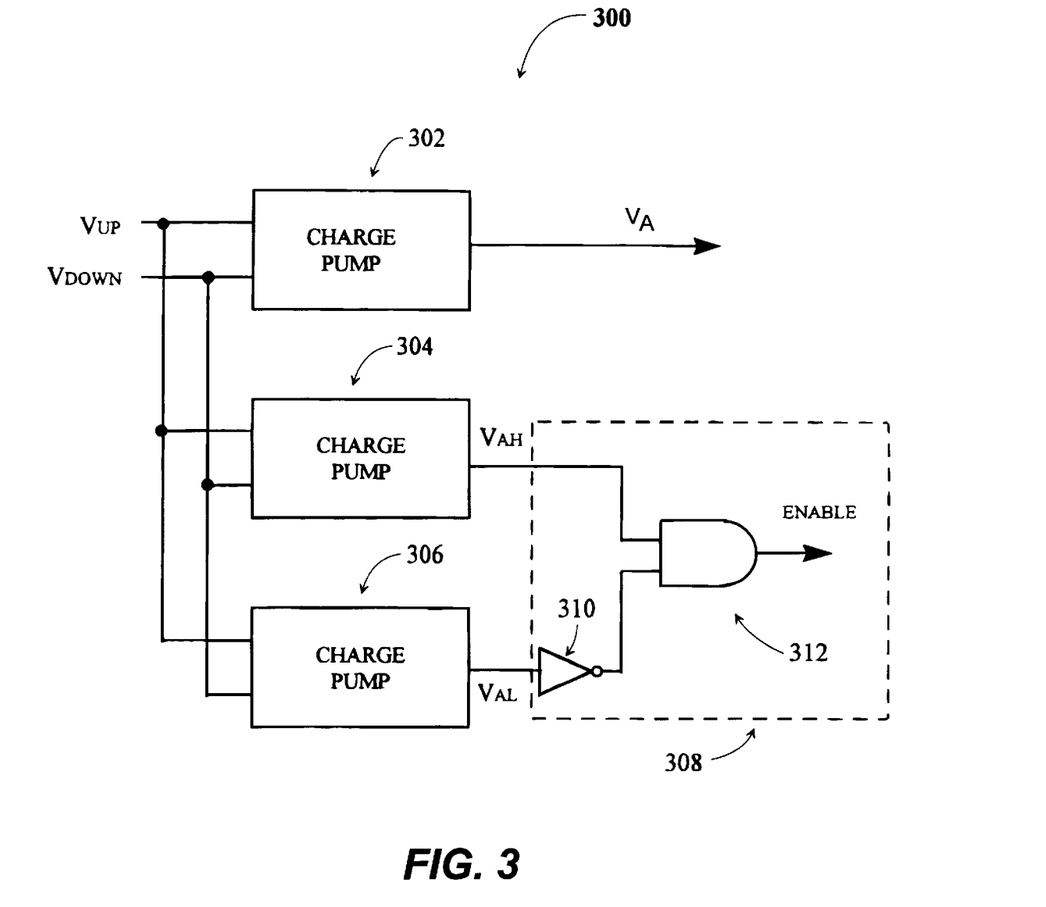
FIG. 3 illustrates a block diagram of an embodiment of an apparatus constructed according to the principles of the present invention.

FIG. 3 illustrates a block diagram of an embodiment of an apparatus or detector 300 constructed according to the principles of the present invention. The detector 300 is parallel-coupled to a first charge pump 302 and includes parallel-coupled second and third charge pumps 304, 306. The charge pumps 302, 304, 306 receive first and second dynamic signals Vup, Vdown with an unknown stability level or amount of time to reach stability. In a preferred embodiment, the first charge pump 302 is employed in an automatic gain control loop as described above. Of course, other applications are well within the broad scope of the present invention. Additionally, while the illustrated embodiment introduces first and second dynamic input signals Vup, Vdown, it is possible that only one signal (with either the first or second signal Vup, Vdown being held constant) or many signals be employed and still be within the broad scope of the present invention.

The first charge pump 302 has a predetermined capacitance and charge and discharge currents and generates an output signal VA as a function of the dynamic input signals Vup, Vdown. Typically, the output signal VA varies up or down until the dynamic input signals Vup, Vdown reach stability. At stability, the output signal VA varies within a relatively small voltage range.

The second and third charge pumps 304, 306 are connected in parallel with the first charge pump 302 and are generally used to mirror the main charge pump (in this case, the first charge pump 302). As will be described, the circuitry of the second and third charge pumps 304, 306 are substantially similar to that of the first charge pump 302, except that different-sized transistors and different-valued capacitors are employed. For example, in one exemplary embodiment, the second charge pump 304 has a smaller capacitance and discharge current than the first charge pump 302 and the third charge pump 306 has a smaller capacitance, but larger discharge current than the first charge pump 302. The second charge pump 304 generates a high output signal VAH and the third charge pump 306 generates a low output signal VAL, both as a function of the dynamic input signals Vup, Vdown.

A control logic 308 (in this exemplary embodiment, including an inverter 310 and an AND gate 312) receive the high output signal VAH and low output signal VAL and produce an enable signal when the high and low output signals VAH, VAL are substantially opposite to each other, logically (e.g., logic high and logic low), indicating that the dynamic signal is stable.

Figure 4:
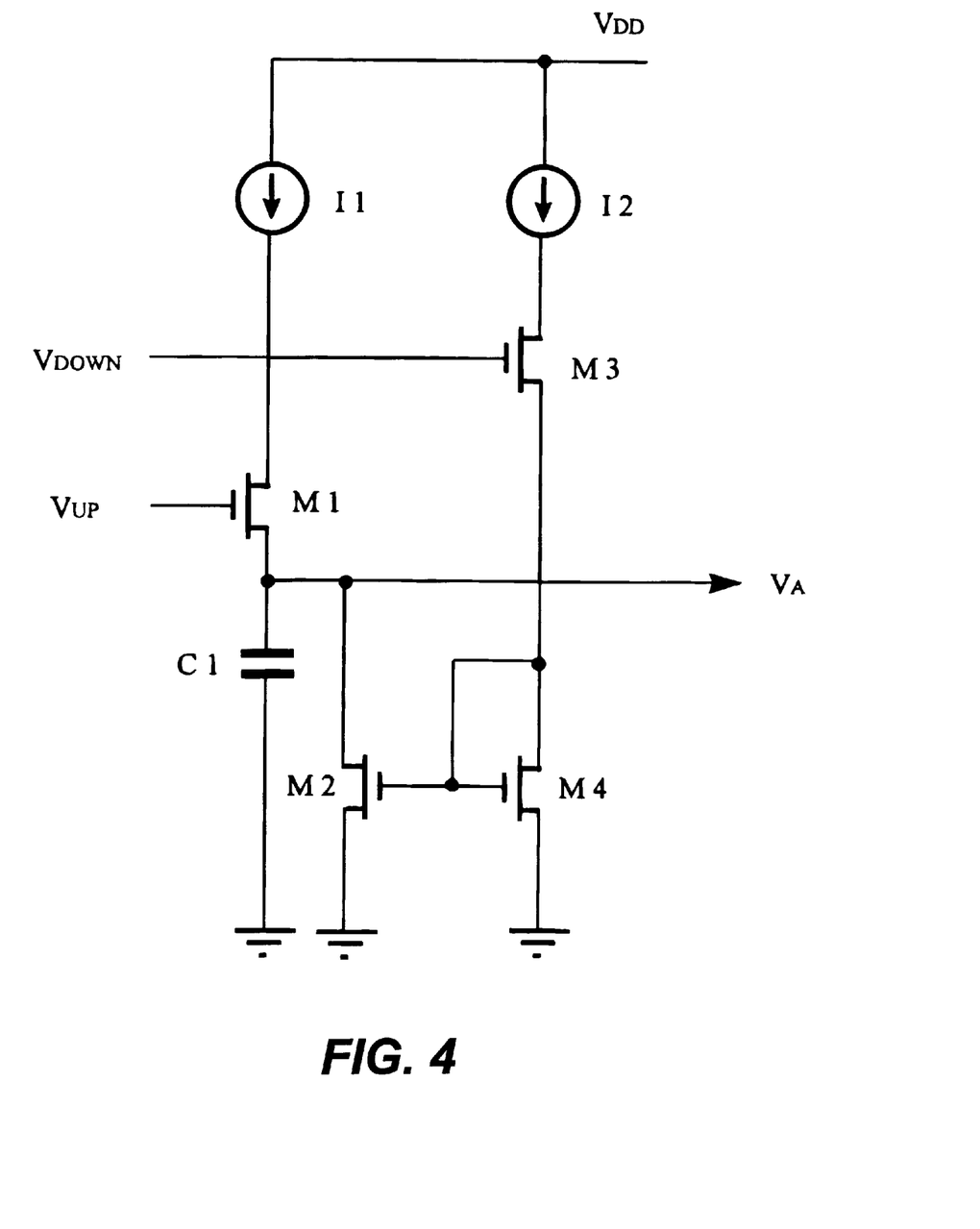
FIG. 4 illustrates a schematic diagram of an exemplary charge pump structure used in accordance with the present invention.

FIG. 4 illustrates a schematic diagram of an exemplary charge pump structure used in accordance with the present invention. The charge pump is coupled to first and second dynamic input signals Vup, Vdown and produces an output signal VA. The charge pump includes first, second, third and fourth transistors M1–M4 and a capacitor C1. The schematic of the charge pump is submitted for exemplary purposes only and other charge pumps can be employed in accordance with the present invention. For instance, a single dynamic input signal could be used to replace one of the first and second dynamic input signals Vup, Vdown, depending on the application. For such an application, the third transistor M3 would be eliminated as should be understood by those skilled in the art. Also, other devices can be employed in lieu of the transistors M1–M4, such as, without limitation, bipolar, complementary metal-oxide semiconductor or gallium arsenide devices.

As explained above, the second and third charge pumps 304, 306 of FIG. 3 are analogous to the charge pump illustrated in FIG. 4, except that the second and third charge pumps 304, 306 employ a different sized second transistor M2 and different values for the capacitor C1. The size of the second transistor M2 employed in the second charge pump 304, is designed, in purpose, to be smaller than that in first charge pump 302. The size of second transistor M2 employed in third charge pump 306, is designed to be larger than that of first charge pump 302. The capacitors C1 used in both the second and third charge pumps 304, 306 are designed to be smaller than that in first charge pump 302.

In the charge pump illustrated in FIG. 4, the output signal VA varies due to the fact that the charge current in the first transistor M1 is, typically, not equal to the discharge current in the second transistor M2. When the dynamic input signals Vup, Vdown are received (before the dynamic input signals Vup, Vdown are stable), the average charge current in the first transistor M1 is different than the average discharge current of the second transistor M2. During equilibrium, the average charge current through the first transistor M1 is equal to the average discharge current in the second transistor M2 and the output signal VA is stable.

With continuing reference to FIG. 3 and assuming that the first, second and third charge pumps 302, 304, 306 include substantially similar components, the capacitors C1 of the second and third charge pumps 304, 306 are smaller than that of the first charge pump 302. A purpose of employing a smaller capacitor C1 is that the high and low output signals VAH, VAL can vary corresponding to:

$$d\text{VAH}/dt = (Ic - Id)/C$$

where Ic is the charge current of the first transistor M1, Id is the discharge current of the second transistor M2, C represents the value of the capacitor C1 and dVAH/dt represents the change of the high output signal VAH over time. Obviously, the smaller the value of the capacitor C1, the faster the high output signal VAH varies over time. The high and low output signals VAH, VAL can, therefore, increase or decrease relatively quickly to an upper (e.g., supply voltage Vdd) and lower (e.g., the ground) limits, respectively.

Since the size of the first transistor M1 in the second charge pump 304 is the same as the first transistor M1 in the first charge pump 302 (thereby providing equivalent charge current) and the size of the second transistor M2 in the second charge pump 304 is smaller than the second transistor M2 in the first charge pump 302 (thereby providing smaller discharge current), the average current through the first transistor M1 in the second charge pump 304 is larger than that of the second transistor M2 (during a period when is the first charge pump 302 is stable). Thus, the high output signal VAH increases. Since a smaller capacitor C1 is employed in the second charge pump 304, the high output signal VAH substantially reaches the supply voltage Vdd. Similarly, since the size of the first transitor M1 in the third charge pump 306 is the same as the first transistor M1 in the first charge pump 302 and the size of the second transistor M2 in the third charge pump 306 is larger than the second transistor M2 in the first charge pump 302, the average current through the first transistor M1 in the third charge pump 306 is smaller than that of the second transistor M2. Thus, the low output signal VAL decreases. Since a smaller capacitor C1 is employed in the third charge pump 306, the low output signal VAL substantially reaches the ground. Finally, the control logic 308 generates an active enable signal indicating when the first control pump 302 is stable.

Figure 5:
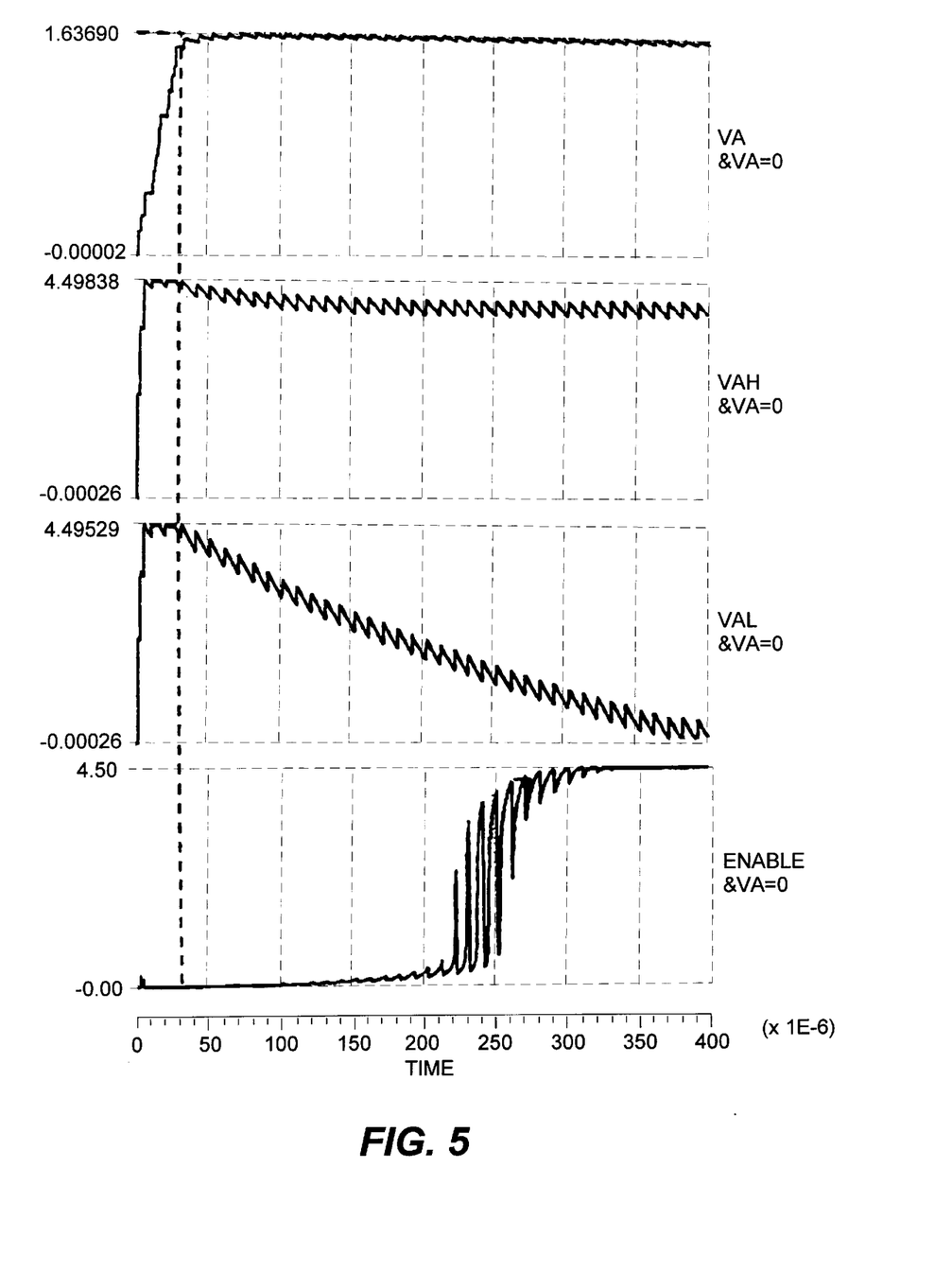
FIGS. 5 and 6 illustrate two example timing diagrams illustrating how an embodiment of an apparatus of the present invention operates in relation to receiving a dynamic signal.
Figure 6:
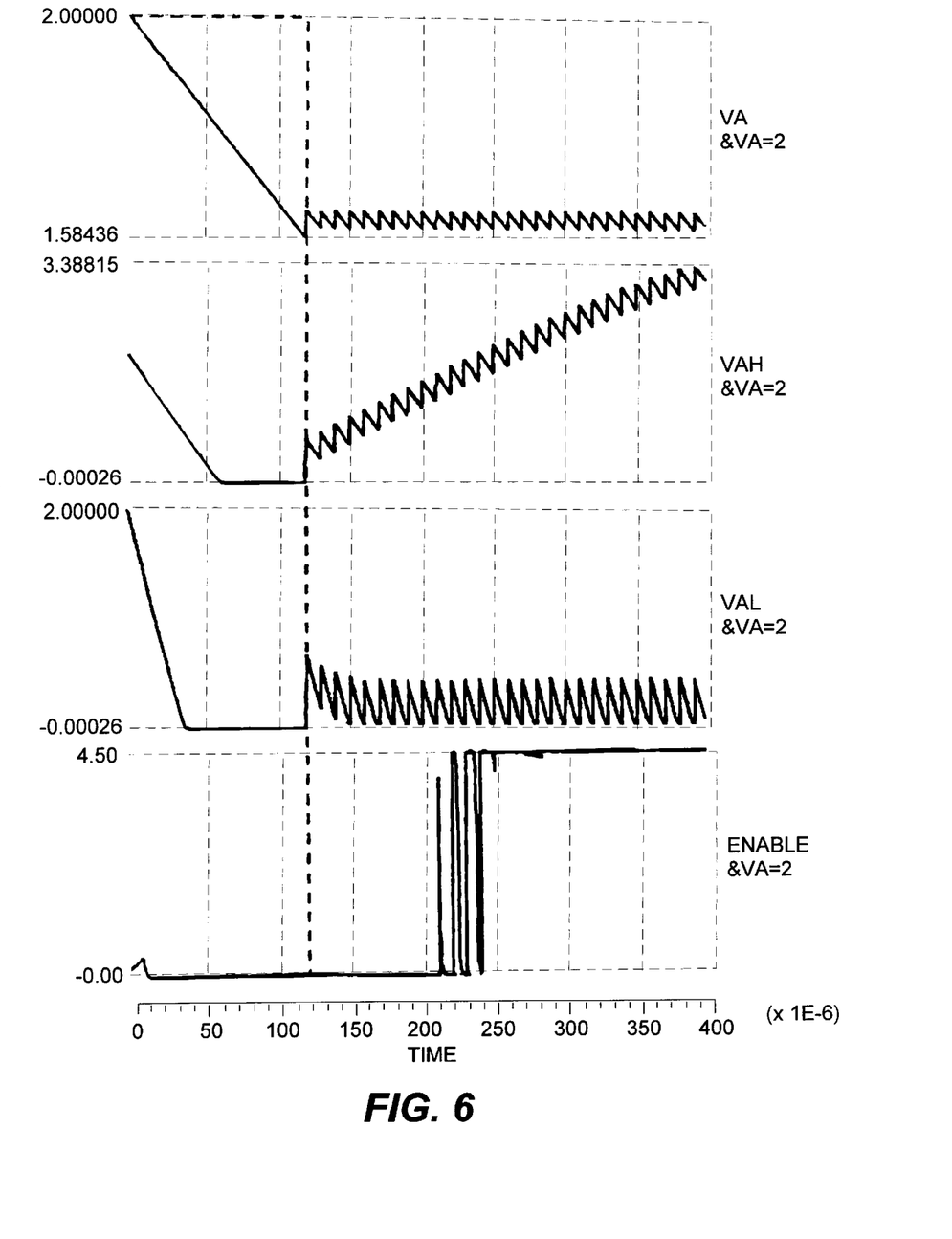

The principles of the present invention can more clearly be described with reference to FIGS. 5 and 6. FIG. 5 illustrates a dynamic output signal VA of the first charge pump 302 of FIG. 3 as the output signal VA varies from a lower to a higher voltage and, then, becomes stable. FIG. 6, on the other hand, illustrates a dynamic output signal VA of the first charge pump 302 of FIG. 3 as the output signal VA varies from a higher to a lower voltage and, then, becomes stable. As illustrated in FIGS. 5 and 6, the final value of the output signal VA is a function of the starting point. In FIG. 5, as the output signal VA goes high (meaning that the charge current of the first transitor M1 of the first charge pump 302 is larger than the discharge current of the second transitor M2 of the first charge pump 302), the high and low output signals VAH, VAL of the second and third charge pumps 304, 306, respectively, go high. After the output signal Va is stable, the high output signal VAH is maintained about the supply voltage Vdd and the low output signal VAL drops to ground resulting in an active enable signal from the control logic 308. In FIG. 6, conversely, the high and low output signals VAH, VAL begin at the ground and after the output signal VA is stable, the high output signal VAH migrates to the supply voltage resulting in an active enable signal from the control logic 308.

It should be noted that the second and third charge pumps 304, 306 can be configured to operate in other ways. For instance, it is possible to modify the second and third charge pumps 304, 306 to have larger or smaller charge currents (instead of discharge currents) than the first charge pump 302, as should be apparent to those skilled in the art. Additionally, the roles of the second and third charge pumps 304, 306 may be reversed such that the high output signal VAH comes from the third charge pump 306 and the low output signal VAL comes from the second charge pump 304.

Figure 7:
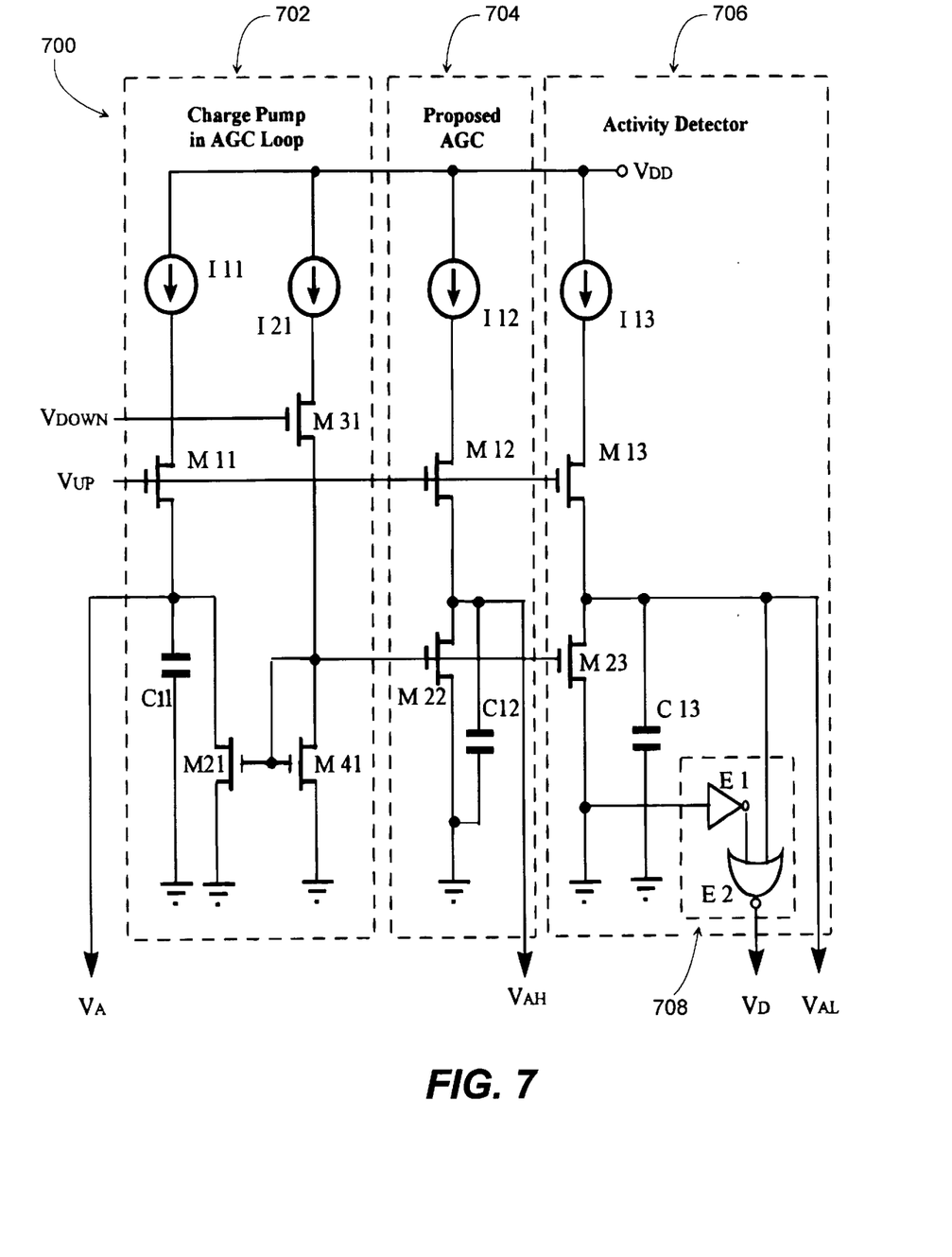
FIG. 7 illustrates a schematic diagram of an exemplary implementation for interconnecting the charge pumps to form an embodiment of an apparatus constructed according to the principles of the present invention.

FIG. 7 illustrates a schematic diagram of an exemplary implementation for interconnecting the charge pumps to form an embodiment of an apparatus constructed according to the principles of the present invention. As an example, first, second and third charge pumps 702, 704, 706 are interconnected to form an embodiment of a detector 700. In this exemplary embodiment, it is advantageous for the charge pumps 702, 704, 706 to share a current source I21 and transistors M31, M41, thereby simplifying the circuit. As a result, the second and third charge pumps 704, 706 contain only first transistors M12, M13 and second transistors M22, M23, current sources I12, I13 and capacitors C12, C13, respectively, thereby providing a less complex and smaller detector 700 (see FIGS. 3 and 4 for comparison). While the control logic 708, in the illustrated embodiment, includes an inverter E1 and NOR gate E2, those skilled in the art understand that other embodiments capable of performing analogous functions are well within the broad scope of the present invention.

The sizes for the second transistor M2i and the values of the capacitors C1i should be chosen in a way to enable the detector 300 to operate well within its maximum time for arriving at a detection measurement.

Exemplary embodiments of the present invention have been illustrated above with reference to specific electronic components. Those skilled in the art are aware, however, that components may be substituted (not necessarily with components of the same type) to create desired conditions or accomplish desired results. For instance, multiple components may be substituted for a single component and vice-versa.

Although the present invention has been described in detail, those skilled in the art should understand that they can make various changes, substitutions and alterations herein without departing from the spirit and scope of the invention in its broadest form.

What is claimed is:

1. An apparatus for detecting when a dynamic signal, is stable said apparatus coupled to a first charge pump connected to receive said dynamic signal and generate a first signal as a function of said dynamic signal, said first charge pump having a predetermined capacitance and discharge current, said apparatus comprising:

a second charge pump connected to receive said dynamic signal and in parallel with said first charge pump, said second charge pump having a smaller capacitance and discharge current than said first charge pump and configured to produce a second signal as a function of said dynamic signal;

a third charge pump connected to receive said dynamic signal and in parallel with said first charge pump and said second charge pump, said third charge pump having a smaller capacitance and larger discharge current than said first charge pump and configured to produce a third signal as a function of said dynamic signal; and control logic configured to receive said second and third signals and produce an active signal when said second and third signals are opposite to each other, logically, indicating that said dynamic signal is stable.

2. The apparatus as recited in claim 1 wherein said first, second and third charge pumps each comprise a transistor.

3. The apparatus as recited in claim 1 wherein said first, second and third charge pumps each comprise a semiconductor device fabricated from the group consisting of:

n-channel metal-oxide semiconductor (NMOS) technology, p-channel metal-oxide semiconductor (PMOS) technology, complementary metal-oxide semiconductor (CMOS) technology and bipolar technology.

4. The apparatus as recited in claim 1 wherein said first, second and third charge pumps are each provided with first and second input signals.

5. The apparatus as recited in claim 1 wherein said control logic comprises an inverter and an AND gate.

6. The apparatus as recited in claim 1 wherein said control logic comprises an inverter and a NOR gate.

7. A telecommunication system, comprising:

an equalizer including:
      a programmable gain amplifier (PGA),
      a pulse shaping filter, and
      first and second automatic gain controllers (AGCs), each of said first and second AGCs including:
         a first charge pump connected to receive a dynamic signal and generate a first signal as a function of said dynamic signal, said first charge pump having a predetermined capacitance and discharge current;
         a second charge pump connected to receive said dynamic signal and in parallel with said first charge pump, said second charge pump having a smaller capacitance and discharge current than said first charge pump and configured to produce a second signal as a function of said dynamic signal;
         a third charge pump connected to receive said dynamic signal and in parallel with said first charge pump and said second charge pump, said third charge pump having a smaller capacitance and larger discharge current than said first charge pump and configure to produce a third signal as a function of said dynamic signal; and
         control logic configured to receive said second and third signals and produce an active signal when said second and third signals are opposite to each other, logically, indicating that said dynamic signal is stable;
      a slicer coupled to said equalizer; and
      a data recoveror coupled to said slicer.

8. The system as recited in claim 7 wherein said first, second and third charge pumps each comprise a transistor.

9. The system as recited in claim 7 wherein said first, second and third charge pumps each comprise a semiconductor device fabricated from the group consisting of:

n-channel metal-oxide semiconductor (NMOS) technology,
   p-channel metal-oxide semiconductor (PMOS) technology,
   complementary metal-oxide semiconductor (CMOS) technology and bipolar technology.

10. The system as recited in claim 7 wherein said first, second and third charge pumps are each provided with first and second input signals.

11. The system as recited in claim 7 wherein said control logic comprises an inverter and an AND gate.

12. The system as recited in claim 7 wherein said control logic comprises an inverter and a NOR gate.

13. An apparatus for detecting when a dynamic signal is stable, said apparatus coupled to a first charge pump connected to receive said dynamic signal and generate a first signal as a function of said dynamic signal, said first charge pump having a predetermined capacitance and charge current, said apparatus comprising:

a second charge pump connected to receive said dynamic signal and in parallel with said first charge pump, said second charge pump having a smaller capacitance and larger charge current than said first charge pump and configured to produce a second signal as a function of said dynamic signal;

a third charge pump connected to receive said dynamic signal and in parallel with said first charge pump and said second charge pump, said third charge pump having a smaller capacitance and smaller charge current than said first charge pump and configured to produce a third signal as a function of said dynamic signal; and control logic configured to receive said second and third signals and produce an active signal when said second and third signals are inverse to each other, logically, indicating that said dynamic signal is stable.

14. The apparatus as recited in claim 13 wherein said first, second and third charge pumps each comprise a transistor.

15. The apparatus as recited in claim 13 wherein said first, second and third charge pumps each comprise a semiconductor device fabricated from the group consisting of:

n-channel metal-oxide semiconductor (NMOS) technology,
   p-channel metal-oxide semiconductor (PMOS) technology, complementary metal-oxide semiconductor (CMOS) technology and bipolar technology.

16. The apparatus as recited in claim 13 wherein said first, second and third charge pumps are each provided with first and second input signals.

17. The apparatus as recited in claim 13 wherein said control logic comprises an inverter and an AND gate.

18. The apparatus as recited in claim 13 wherein said control logic comprises an inverter and a NOR gate.

19. A telecommunication system, comprising:
   an equalizer including:
      a programmable gain amplifier (PGA),
      a pulse shaping filter, and
      first and second automatic gain controllers (AGCs), each of said first and second AGCs including:
         a first charge pump connected to receive a dynamic signal and generate a first signal as a function of said dynamic signal, said first charge pump having a predetermined capacitance and charge current;
         a second charge pump connected to receive said dynamic signal and in parallel with said first charge pump, said second charge pump having a smaller capacitance and larger charge current than said first charge pump and configured to produce a second signal as a function of said dynamic signal;
         a third charge pump connected to receive said dynamic signal and in parallel with said first charge pump and said second charge pump, said third charge pump having a smaller capacitance and charge current than said first charge pump and configured to produce a third signal as a function of said dynamic signal; and
         control logic configured to receive said second and third signals and produce an active signal when said second and third signals are opposite to each other, logically, indicating that said dynamic signal is stable;
      a slicer coupled to said equalizer; and
      a data recoveror coupled to said slicer.

20. The system as recited in claim 19 wherein said first, second and third charge pumps each comprise a transistor.

21. The system as recited in claim 19 wherein said first, second and third charge pumps each comprise a semiconductor device fabricated from the group consisting of:
   n-channel metal-oxide semiconductor (NMOS) technology,
   p-channel metal-oxide semiconductor (PMOS) technology,
   complementary metal-oxide semiconductor (CMOS) technology and bipolar technology.

22. The system as recited in claim 19 wherein said first, second and third charge pumps are each provided with first and second input signals.

23. The system as recited in claim 19 wherein said control logic comprises an inverter and an AND gate.

24. The system as recited in claim 19 wherein said control logic comprises an inverter and a NOR gate.

* * * * *